(12) United States Patent
Freytag

(10) Patent No.: US 12,000,913 B2
(45) Date of Patent: Jun. 4, 2024

(54) NMR PROBEHEAD

(71) Applicant: Bruker Switzerland AG, Fällanden (CH)

(72) Inventor: Nicolas Freytag, Binz (CH)

( * ) Notice: Subject to any disclaimer, the term of this patent is extended or adjusted under 35 U.S.C. 154(b) by 0 days.

(21) Appl. No.: 18/343,820

(22) Filed: Jun. 29, 2023

(65) Prior Publication Data

US 2024/0004004 A1   Jan. 4, 2024

(30) Foreign Application Priority Data

Jul. 1, 2022   (DE) .............................. 102022206767

(51) Int. Cl.
*G01R 33/34* (2006.01)
*G01R 33/36* (2006.01)

(52) U.S. Cl.
CPC . *G01R 33/34053* (2013.01); *G01R 33/34092* (2013.01); *G01R 33/3635* (2013.01)

(58) Field of Classification Search
CPC ........ G01R 33/34053; G01R 33/34092; G01R 33/3635
See application file for complete search history.

(56) References Cited

U.S. PATENT DOCUMENTS

| | | | |
|---|---|---|---|
| 5,293,519 A * | 3/1994 | Yoshino | G01R 33/34053 324/318 |
| 6,087,832 A | 7/2000 | Doty | |
| 6,359,437 B1 * | 3/2002 | Barbara | G01R 33/34046 324/318 |
| 6,487,437 B1 * | 11/2002 | Viswanathan | G01R 33/287 128/899 |
| 6,751,847 B1 | 6/2004 | Brey et al. | |
| 2005/0146331 A1 | 7/2005 | Flexman | |
| 2012/0074935 A1 | 3/2012 | Crozier | |
| 2012/0098536 A1 * | 4/2012 | Liedke | G01R 33/34053 324/309 |
| 2013/0009645 A1 * | 1/2013 | Miki | G01R 33/307 324/322 |
| 2015/0185299 A1 * | 7/2015 | Rinard | G01R 33/34053 324/322 |

(Continued)

FOREIGN PATENT DOCUMENTS

JP   2009216579   9/2009

OTHER PUBLICATIONS

Doty et al., Using a cross-coil to reduce RF heating by an order of magnitude in triple-resonance multinuclear MAS at high fields, Journal of Magnetic Resonance 182 (2006) 239-253.

(Continued)

*Primary Examiner* — Steven L Yeninas
(74) *Attorney, Agent, or Firm* — Benoît & Côté Inc.

(57) ABSTRACT

An NMR probe head has a transceiver coil arrangement with a first transceiver coil for generating a first RF magnetic field B1, wherein the first transceiver coil comprises an electrical conductor having multiple windings about a longitudinal axis Z', and wherein the electrical conductor of the first transceiver coil is designed as a strip-shaped conductor with a conductor width W that decreases at least twice and increases at least twice within each winding. The NMR probe head thereby has a transceiver coil that has maximum quality factor with simultaneous transparency to other RF magnetic fields that may be radiated.

14 Claims, 7 Drawing Sheets

(56) References Cited

U.S. PATENT DOCUMENTS

2019/0025388 A1* 1/2019 Shimizu ............... G01R 33/307

OTHER PUBLICATIONS

Privalov et al., Coil Design for Large Volume High-B1 Homegeneity for Solid-State NMR Applications, Journal of Magnetic Resonance, Series A 123, 157-160 (1996).
Gorkov et al., Using Low-E resonators to reduce RF heating in biological samples for static solid-state NMR up to 900 MHz, Journal of Magnetic Resonance 185 (2007) 77-93.
Collier Kelsey A et al: "Design and construction of a quadruple-resonance MAS NMR probe for investigation of extensively deuterated biomolecules", Journal of Magnetic Resonance, vol. 285, No. 12, Oct. 2017.

* cited by examiner

NMR PROBEHEAD

BACKGROUND OF THE INVENTION

The invention relates to an NMR probe head with a transceiver coil arrangement with a first transceiver coil for generating a first RF magnetic field B1, wherein the first transceiver coil comprises an electrical conductor with multiple windings about a longitudinal axis Z', wherein the electrical conductor of the first transceiver coil is designed as a strip-shaped conductor with a conductor width W.

A coil for an NMR probe head with a strip-shaped conductor is known from Privalov et al., Coil Design for Large Volume High-B1 Homogeneity for Solid-State NMR Applications, Journal of Magnetic Resonance, series A 123 (1996), 157-160.

Probe heads for nuclear magnetic resonance spectroscopy (NMR) can be used to examine different nuclei. In order to excite different nuclei, it is known to use multiple, in particular two coils, which generate magnetic fields perpendicular to each other (cross-coil NMR measurement heads). However, there is the problem that the magnetic field of one coil is disturbed or partially shielded by the conductor of the other coil.

Gorkov et al., Using low-E resonators to reduce RF heating in biological samples for static solid-state NMR up to 900 MHz, Journal of Magnetic Resonance 185 (2007) 77-93 discloses a cross-coil resonator arrangement for magic angle spinning (MAS) NMR measurements in which a solenoid coil tuned to 15N nuclei is located within an annular gap resonator tuned to 1H nuclei.

Another cross-coil resonator arrangement is known from Doty et al., Using a cross-coil to reduce RF heating by an order of magnitude in triple-resonance multinuclear MAS at high fields, Journal of Magnetic Resonance 182 (2006) 239-253. Here, a variable pitch solenoid coil is mounted outside a cross-coil tuned to 1H cores. The cross coil is a saddle coil tuned to 1H cores, the field of which radiates transversely through a circular cylindrical measurement sample. The outer solenoid coil is tuned to 13C and 15N measurement frequencies and generates further RF magnetic fields that are aligned axially to the measurement sample. In order to achieve sufficient transparency for the alternating magnetic field at the 1H frequency, the clearances between the windings of the solenoid coil must be sufficiently large. However, this has the result that usually the quality factor of the solenoid coil turns out lower than the optimum possible for the given coil geometry. This applies both to the configuration with solenoid coil as inner coil as well as to the configuration with the solenoid coil outside a 1H coil or a 1H resonator. In the aforementioned Doty article, part of the quality factor loss is to be compensated by using a conductor with an oval cross-section for the solenoid coils, where the long axis is radially aligned with the longitudinal axis Z' of the transceiver coil. However, this increases the effective diameter on which the current density is set so that, as the ovality increases, there is a reduction in the RF field generated for the same current.

In addition to coil geometries based on conductors with a round or oval cross-section, it is also known to use strip-shaped conductors for NMR probe heads. In particular, such coil geometries can be structured on a cylindrical conductor (e.g., by structurally applying a metallic layer on a substrate with a cylindrical surface or by structuring a uniformly applied conductor using subtractive manufacturing processes) or cut out from a cylindrical jacket-shaped conductor. These manufacturing methods enable greater freedom in the design of the coil geometry, in particular a variable pitch.

U.S. Pat. No. 6,751,847 discloses a coil consisting of a strip-shaped conductor with a constant gap width, which coil is structured on the outer side of a cylinder jacket made of an electrically conductive layer.

The aforementioned Privalov article discloses a coil geometry with a strip-shaped conductor with a variable conductor width and constant gap width. By varying the width, the inhomogeneity in the axial direction is to be minimized. The distance between the windings is kept small in order to minimize the inhomogeneity of the field in the radial direction. Due to the small distances between the windings, this coil geometry however has a low transparency and is therefore not suitable for a cross-coil arrangement.

SUMMARY OF THE INVENTION

The invention provides an NMR probe head which has a transceiver coil that has a maximum quality factor with simultaneous transparency to further RF magnetic fields that may be radiated.

In the transceiver coil of the NMR probe head according to the invention, the conductor width W decreases and increases at least twice and increases at least twice within each winding.

The conductor width is the width of the conductor perpendicular to the conductor center. According to the invention, two regions with a minimum conductor width and two regions with a maximum conductor width exist within each winding. Thus, according to the invention, the conductor width is a function of the position along the course of the conductor (W=W(t), where t is a parameter running between 0 and the number of windings N, with t∈$\mathbb{R}$ and 0≤t≤N, N∈$\mathbb{R}$ is the number of windings). The regions of minimum width achieve a higher transparency for magnetic fields, while the quality factor of the transceiver coil is optimized by the regions of maximum width. In this way, a higher transparency for magnetic fields is achieved without too strongly negatively influencing the quality factor of the transceiver coil.

In a specific embodiment, the regions with maximum conductor width have the same conductor width.

In one embodiment, the conductor width W varies periodically, in particular such that the regions of the electrical conductor with minimum values for the conductor width are arranged offset by 180° with respect to a rotation about the longitudinal axis.

The regions of the conductor with minimum conductor width are thus preferably spaced apart from one another by half a winding in each case. Accordingly, the regions of the conductor with maximum conductor width are then also each spaced apart from one another by half a winding. Regions of the electrical conductor with minimum conductor width are preferably arranged rotated by 90° with respect to the regions with maximum conductor width with respect to a rotation about the longitudinal axis Z', i.e., are spaced apart from each other by a quarter of a winding. A straight line through every second region of the electrical conductor with minimum conductor width thus runs parallel to the longitudinal axis Z'. In this embodiment, regions with minimal conductor width are situated on opposite cylinder jacket segments, which has the result that clearances with maximum conductor width are also arranged on opposite cylinder jacket segments. This allows the transparency of the transceiver coil arrangement to be increased without negatively affecting the quality factor of the coil too much. This is particularly advantageous for cross-coil arrangements, i.e., when a second RF magnetic field generated by another transceiver coil arrangement is to be superimposed on the first RF magnetic field (see below). The probe volume is then "visible" to both RF magnetic fields. At the same time, the transceiver coil arrangement can have a larger conductor width in the other regions, as a result of which the quality factor of the coil is increased. A coil with a constant conductor width or constant gap width has a lower quality factor than the transceiver coil according to the invention with the same transparency to a further RF magnetic field, in particular when the ratio of conductor width to conductor spacing is <5, better <2, in particular <1.

The conductor width W preferably varies between 0.1 mm and 2 mm.

Furthermore, in the case of a combination of a first transceiver coil with T≠0 that generates an RF magnetic field lying substantially within the measurement sample in an X'Z' plane of a Cartesian X', Y', Z' coordinate system and a further transceiver coil that generates a second RF magnetic field B2, which in the measurement sample lies substantially in a Y'Z' plane, an embodiment of the first transceiver coil is advantageous which has four maxima and four minima per winding, the minima being in the X' and Y' direction and the maxima being at 45° between X' and Y'.

It is particularly advantageous if the transceiver coil is made of a metallic layer (coating) on a dielectric substrate. This allows maximum flexibility in the realization of the structure of the conductor. Suitable substrates are in particular materials with low dielectric losses, such as sapphire, aluminum oxide ceramic, teflon, aluminum nitrite, quartz, and glass.

The coating may be applied to the inside and/or outside of the dielectric substrate and structured by wet-chemical and/or reactive/non-reactive vacuum etching processes and/or laser ablation processes. Alternatively, selective metallization can be used, with vacuum deposition and electroplating processes being particularly advantageous. Due to the high precision of the layer growth and the possibility of achieving high purity of the deposited materials, vacuum deposition methods are advantageous in particular when the coil is operated at cryogenic temperatures. Galvanic methods can be carried out quickly and cost-effectively, in particular for thick coatings above 50 µm.

The production of the transceiver coil from a metallic tube is likewise advantageous. The structuring can take place by cutting out regions which are not required, for example by milling, laser cutting, or water jet cutting, from a tubular blank. The advantage of this is a large conductor thickness d which can be achieved at low cost and which can be significantly greater than with coating processes. This can be advantageous for samples with a diameter greater than or equal to 5 mm, in particular greater than or equal to 10 mm, and low measuring frequencies, in order to make it possible to achieve a high electrical conductivity of the coil. Furthermore, such a transceiver coil can be manufactured without a carrier, in particular without a carrier between the conductor and the measurement sample, so that the efficiency is increased. This is particularly advantageous for small measurement samples with diameters <5 mm. To further improve the conductivity, methods for rounding the cut edges (e.g., vibratory finishing) can be used, or the cut edges can be rounded, for example by milling.

The conductor thickness d of the conductor (i.e., the extension of the electrical conductor in the radial direction relative to the longitudinal axis Z' of the transceiver coil) may be at most 1 mm (preferably at most 200 µm) and/or is at least as large as twice the penetration depth of the RF current into the electrical conductor. Furthermore, it is advantageous if the conductor thickness is at least 20 µm, preferably at least 100 µm. The penetration depth is to be understood as the depth at which the current density has dropped to 1/e of the value at the conductor surface (skin effect). It is a function of the material of the electrical conductor and the frequency of the RF magnetic field generated therewith.

$$\delta = \sqrt{\frac{2\rho}{\omega\mu}},$$

wherein
ρ: specific resistance,
$\mu=\mu_0\mu_r$: absolute permeability,
$\omega=2\pi f$: circular frequency.

However, if a transceiver coil is used at multiple frequencies, the conductor thickness d can then also be d<2δ at the lowest operating frequencies.

For conductor thicknesses d of the conductor that are greater than 250 µm, in particular greater than 500 µm, transmit/receive coils made of rounded conductor material have higher quality factor than transmit/receive coils made of laminated material because the current density at the rounded parts is distributed over a larger area than in the case of a rectangular conductor cross-section, and the surface area used of the conductor can thereby be increased. In particular, oval conductor cross-sections, such as are produced for example by pressing circular wires, are advantageous.

The conductor width W preferably varies between 0.5 mm and 2 mm. For conductor widths less than 0.5 mm, manufacturing is difficult, edge effects resulting from structuring dominate the conductivity, and impurities in the raw material can prove to be problematic. For conductor widths larger than 2 mm, for measurement sample dimensions typical in NMR a solenoid coil with sufficient inductance is not possible without configuring multiple layers radially. Transceiver coils with multiple layers, however, greatly reduce transparency to a second RF magnetic field, making them disadvantageous for cross-coil arrangements.

A specific embodiment provides that the windings of the transceiver coil are inclined relative to the longitudinal axis Z' of the transceiver coil. The inclination is defined as the amplitude of a sinusoidal modulation of the Z' position of the conductor center plane over one winding. A coil with inclination T≠0 can in principle also be described by a variable slope $S'(t)=S(t)+T(t)\cos(2\pi t+\varphi)$ (general slope). If S'(t) is written as a Fourier series, then T describes the (t=1)-periodic part of the slope. For each winding, the slope can be written as:

$$S'(t)=S_0+\Sigma_{k=1}^{\infty}(S_{k,a}\cos(k2\pi t)+S_{k,b}\sin(k2\pi t)),$$
wherein $$S(t)=S'(t)-(S_{1,a}\cos(2\pi t)+S_{1,b}\sin(2\pi t)).$$

$(S_{1,a}\cos(2\pi t)+S_{1,b}\sin(2\pi t))$ can be written as $T(t)\cos(2\pi t+\varphi)$ where T is the inclination and φ is the direction of the inclination (usually φ=0° or φ=90°).

The inclination T can vary over the course t of the length of the electrical conductor (T=T(t)). In this case, the inclination is constant in sections, in particular for at least one half winding. The inclination then changes from half-winding to half-winding, i.e., each half-winding is inclined with an inclination T with respect to the longitudinal axis Z', where for at least a part of the half-windings (half-winding) T≠0 applies. The inclination T of the windings has an influence on the B1 amplitude and the radial homogeneity. This is advantageous in particular for MAS NMR measurements, because the efficiency of the transceiver coil can be increased, in particular when this coil is designed as a solenoid coil or comprises solenoid-shaped sections. In MAS NMR measurements, a measurement sample is rotated about the longitudinal axis Z', which is preferably tilted by the magic angle θ (θ=54.74°) relative to a Z-axis which is defined by the static magnetic field B0 and in which the elongate extension of the NMR probe head extends during operation (i.e., when the NMR probe head is mounted in the NMR apparatus). Due to the inclination of the windings of the transceiver coil, field components of the RF magnetic field B1 can be minimized parallel to the static magnetic field B0, or the field components of the RF magnetic field B1 can be maximized orthogonally to the static magnetic field B0. However, due to the inclination of the windings, unlike conventional (non-inclined) solenoid coils, the RF magnetic field B1 is no longer parallel to the longitudinal axis Z' of the coil so that the conductors of the coil "get in the way of the field it generates." A reduction of the conductor width of the inclined solenoid coil in these regions increases the transmission efficiency and the possible signal-to-noise ratio of an inclined solenoid coil according to the invention.

A particular embodiment of the MR probe head according to the invention provides that the transceiver coil arrangement comprises at least one further transceiver coil for generating a second RF magnetic field B2, that the first transceiver coil and the further transceiver coil are arranged about the common longitudinal axis Z' in such a way that RF magnetic fields B1, B2 generated by the first transceiver coil and the further transceiver coil are aligned perpendicular to one another; and that the conductor width W of the electrical conductor of the first transceiver coil has a minimum value (taper) in the region in which the surface normal of the first transceiver coil is parallel to the second RF magnetic field B2. In other words, in the area of the surface of the first transceiver coil that the RF magnetic field B2 must penetrate to excite the measurement sample in the field of view, the conductor width W of the electrical conductor of the first transceiver coil is minimum, in order to create a transparency region for B2.

The two transceiver coils may be tuned to different frequencies. Fields B1, B2 perpendicular to one another means that the volume integral of the scalar product of the vectors B1(x,y,z) and B2(x,y,z) is approximately zero at least over the area of the field of views of the two coils in which a measurement sample is situated; i.e., only the B1, B2 fields within the measurement sample are considered. In a specific embodiment, the decoupling of the two RF magnetic fields B1 and B2 is achieved by a matching network, i.e., the RF magnetic fields B1 and B2 generated directly by the two transmission reception coils do not have to be exactly orthogonal to one another.

Due to the minimum value of the conductor width W of the electrical conductor of the first transceiver coil in the region in which the surface normal of the first transceiver coil (vector perpendicular to the cylinder surface of the first transceiver coil) is parallel to the second RF magnetic field B2, the first transceiver coil arrangement exhibits high transparency to the second RF magnetic field B2.

It is further advantageous if a carrier at least partially fills the space between the first transceiver coil and the further transceiver coil. If a material with high dielectric strength is used, electrical breakdown can be avoided when transmitting RF pulses, in particular during the transmission of simultaneous RF pulses.

In a particular embodiment, a third transceiver coil arrangement for generating a third RF magnetic field B3 is provided, wherein the third RF magnetic field B3 is preferably perpendicular to the first RF magnetic field B1 and to the second magnetic field B2, and the conductor width of the first transceiver coil has a minimum value in the region in which the surface normal of the first transceiver coil is parallel to the third RF magnetic field B3.

Thus, the conductor width W of the strip conductor of the transceiver coil arrangement then decreases periodically along the circumference of the circular cylinder of the coil in the region of the B2 field and the B3 field. Each winding then thus has four regions at which the conductor width has a minimum value.

The further transceiver coil may be formed as a saddle coil or a resonator, e.g., Alderman-Grant, birdcage, or loop-gap resonator.

In one embodiment, the first transceiver coil has at least one solenoid-shaped (spiral) section. In particular, the first transceiver coil can be a solenoid coil. The transceiver coil may comprise exclusively solenoid-shaped sections, thus comprising exclusively windings that run around the longitudinal axis Z' of the transceiver coil.

In one version of the invention, the transceiver coil comprises at least three windings.

In general, the envelope of the electrical conductor of a circular cylindrical solenoid coil is defined as follows (where the ends of the coils are not covered by the parametric representation of the formulas below):
in Cartesian coordinates $$\left( \begin{array}{c} R\sin(2\pi t) \\ R\cos(2\pi t) \\ P(t)*t \pm \dfrac{W(t)}{2} + T(t)*\cos(2\pi t + \varphi) \end{array} \right), \text{ with } t \in \{0 \ldots N\},$$

(defined accordingly also for started windings)
wherein
$P=\int_{tn}^{m+1} S(t)\, dt$ is the pitch of the windings (i.e., the path that is covered by a winding in the Z' direction) and S is the local slope, where to is the t at the beginning of the n-th winding, i.e., tn=0, 1, . . . , T is the inclination (defined here as amplitude of a sinusoidal modulation of the
Z' position of the conductor center plane over one winding),
R is the radius, and
N is the number of windings of the transceiver coil, with N∈ ℝ and 3≤N,
t is a parameter running between 0 and one winding number of the transceiver coil arrangement, with t∈ ℝ and 0≤t≤N.

Preferably, the number N of windings is integer or half-integer (N∈ ℕ or 2N∈ ℕ).

A particular embodiment of the MR probe head according to the invention provides that the electrical conductor of the first transceiver coil comprises a forward winding section and a return winding section, wherein the forward winding section comprises forward windings and, starting from a connection region, leads in a predetermined winding sense to an axial end of the transceiver coil, wherein the return winding section comprises return windings and, starting from the axial end of the transceiver coil, leads in the same predetermined winding sense to the connection region, the windings of the return winding section having a pitch P of opposite sign to those of the forward winding section, and in that forward and return windings of the electrical conductor, with the exception of crossover regions in which the forward and return windings cross over, are arranged on a common cylindrical jacket surface about the longitudinal axis Z' (="crisscross geometry"). Thus, in this embodiment, the transceiver coil has two solenoid-shaped conductor sections (forward winding section and return winding section).

The forward and return windings are therefore at the same radial distance around the longitudinal axis Z', i.e., there are windings running in opposite directions on a common surface. The connection area is used to connect the electrical coil section to a matching network and may comprise connections for multiple electrical coil sections. The forward winding section and the return winding section form a coil section that runs between two terminals of the terminal section, so that the applied voltage is applied between the beginning of the forward windings and the end of the return windings of the respective coil section. In order to arrange the forward windings and return windings on a common cylinder surface, the forward windings and the return windings must cross each other. The crossovers are carried out on a section of the circumference (crossover area) that has as small an extension as possible, wherein preferably the electrical conductor of the forward winding section or of the return winding section remains on the cylinder surface, whereas the respective other electrical conductor crosses over the first electrical conductors in the form of a bridge element.

By means of this specific embodiment, the arrangement of the windings and of the connection region can be selected such that the potentials during operation of the transceiver coil are equal or similar in magnitude to comparable positions of adjacent windings (for example at the beginning of the winding or in the center or at the end). The potential is considered similar if $U1/UN=(N/2-1)/(N/2)$ with U1: voltage over the first winding; UN: voltage over N windings. In a preferred embodiment, in which the coil section comprises a reversal winding which in operation has a point with potential 0 (which is set by a so-called balanced network), the forward windings and return windings of a coil section, with the exception of the reversal winding, are therefore preferably arranged in alternating fashion. In this way, the electric fields visible to an electrically conductive sample can be reduced, and at the same time other performance losses can be reduced. This embodiment is particularly advantageous for the examination of conductive measurement samples or measurement samples with high dielectric losses. The geometric arrangement of the conductor sections on a common cylinder surface according to the invention makes it possible to greatly minimize the electrical fields generated by the coils of the NMR probe head in the measurement sample. Electric fields can lead to performance losses both during transmission and during reception, for example the heating of the measurement sample, lengthening of pulse angles with limited transmission power, reduction of the signal-to-noise ratio, etc.

Multiple coil sections can also be provided, each comprising a forward winding section and a return winding section.

In a specific embodiment, it can be provided that the slope S of the windings, in particular the pitch P, of the first transceiver coil varies along the course of the conductor. Thus, the slope is a function of the position along the coil section ($S=S(t)$). A change in the slope $S=S(t)$ can be realized by a change in the pitch P, but also by a change in the local slope S within a winding with constant P.

For a constant pitch P, the local slope S(t) can vary within one winding and can even reverse sign. The pitch P of a winding is to be referred to as positive when the Z' coordinate of the center lines for tn+1 is greater than the Z' coordinate at tn. This holds even if the Z' coordinate in the interval between tn and tn+1 takes smaller values than at tn. The homogeneity along the longitudinal axis Z' of the transceiver coil (on-axis) can be improved by a variable pitch P or variable slope S.

The multiple windings can also be realized as individual resonators which are coupled inductively or capacitively. The pitch P then describes the distance between two adjacent individual resonators.

For finite coils, the amplitude of the B1 magnetic field drops off at the axial ends. By reducing the pitch P at the axial ends, it can be achieved that the windings are situated closer together. In this way, the current density that is missing due to the finiteness of the coil can be compensated. An improvement of the homogeneity along the longitudinal axis Z' for short coils therefore results in particular when the pitch P at the axial ends of the transceiver coil is smaller than in the axial center.

On the other hand, if a "short" coil with alternately arranged forward and return winding sections (crisscross geometry—see above) is operated at/in the vicinity of the natural resonance, it is advantageous to reduce the pitch P in the center of the conductor, because the approximately sinusoidal current distribution along the coil section length reduces the generated field in the region of the conductor ends, which come to rest either at one end or in the center of the coil.

To improve the homogeneity in the radial direction (off-axis), a further embodiment of the MR probe head according to the invention provides that the windings of the transceiver coil along the conductor have a variable inclination with respect to the longitudinal axis Z' of the first transceiver coil, i.e., $T=T(t)$.

Furthermore, there is also the possibility of forming the transceiver coil or parts of the transceiver coil not with a helical shape, but rather as a zero-pitch coil. In this case, at least one winding has a slope $S=0$ over a large part of its length. Such a winding then forms a non-closed ring, i.e., $S(t)=0$ is valid for $t=t0 \ldots t0+1-\varepsilon$ or $t=t0+ \ldots \varepsilon/2 \ldots t0+1-\varepsilon/2$, with $\varepsilon>0$, where $\varepsilon>0$ prevents a short circuit; $t=t0$ is the beginning of the winding. However, the pitch P of a complete winding has a magnitude not equal to 0 in order to ensure a gap width $D>0$ between the windings. Here, $P(t)$ can be constant or can vary from winding to winding. For a non-inclined transceiver coil arrangement (i.e., for $T=0$), the windings are oriented perpendicular to the longitudinal axis Z' over the complete range in which they have slope $S=0$. Such a transceiver coil arrangement can be designed as a combination of non-closed "rings" without slope and short winding sections with slope $S>>0$. In a specific embodiment, a portion of a winding can be aligned perpendicular to the longitudinal axis Z' of the transceiver coil. The transceiver coil can thus be designed as a combination of non-closed "rings" without (local) slope and portions of the electrical conductor with slope $S>0$. As a result, the ratio W/D of the conductor width W to the gap width D can be kept constant across the transceiver coil arrangement. As a result, the quality factor of the transceiver coil arrangement can be maximized, and the electrical fields can be minimized, in a particularly simple manner.

One particular embodiment provides that at least two of the quantities inclination T, slope S, and conductor width W change over the course t of the length of the electrical conductor of the transceiver coil, in particular the slope S and one of the quantities inclination T and conductor width W. In this way, a transceiver coil optimized for the signal-to-noise ratio (SNR) can be realized.

Further advantages of the invention will become apparent from the description and the drawings. Likewise, the features according to the invention that are mentioned above and set out in the following can each be used individually per se or together in any desired combinations. The embodiments shown and described are not to be understood as an exhaustive list but instead are of an exemplary nature for describing the invention.

DETAILED DESCRIPTION

Figure 1:
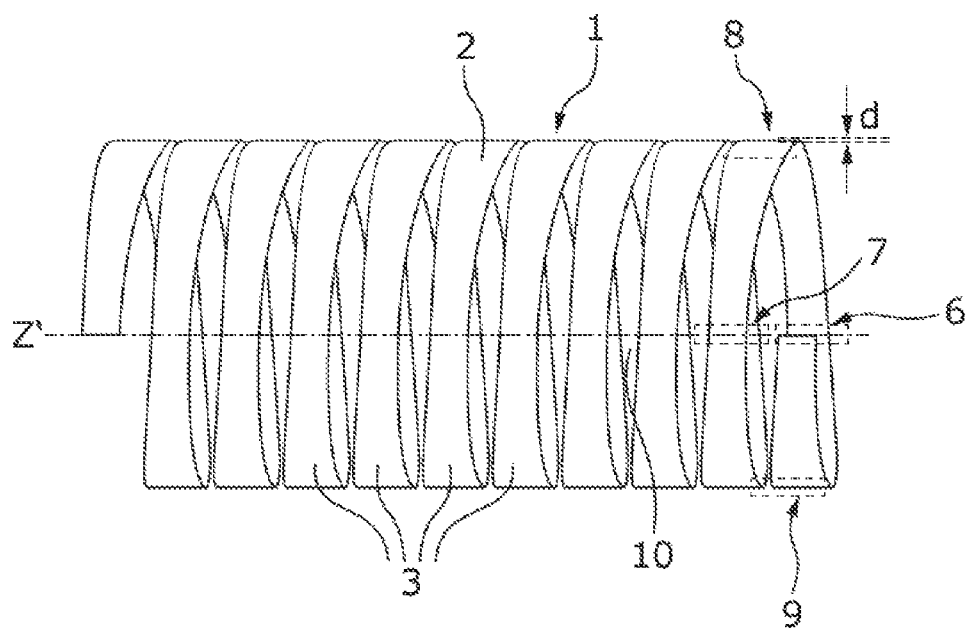
FIG. 1 shows a perspective view of an embodiment of a transceiver coil in which the conductor width varies periodically within each winding.

FIG. 1 shows a perspective view of a preferred embodiment of a first transceiver coil 1 for generating a first RF magnetic field B1 for an NMR probe head according to the invention. The first transceiver coil 1 comprises an electrical conductor 2 with N (here: N=10) windings 3 that are arranged around a longitudinal axis Z'. The first transceiver coil 1 is solenoid-shaped and the windings 3 are wound or arranged in a cylindrical shape around an imaginary circular cylindrical surface.

The electrical conductor 2 is designed as a single strip-shaped conductor ("conductor track"), i.e., the conductor has a conductor width which is greater (in particular at least one order of magnitude greater) than the thickness of the conductor. A strip conductor has a substantially rectangular cross section. According to the invention, the electrical conductor 2 has a variable conductor width W (see FIGS. 3a, 3b), i.e., W=W(t), where t is a parameter running between 0 and a number of windings of the transceiver coil 1, with t∈ ℝ and 0≤t≤N, where N is the number of windings of the first transceiver coil 1 with N∈ℝ and 3≤N. Furthermore, the conductor has a conductor thickness d. In the embodiment shown here, each winding has a first region 6 with a minimum conductor width Wmin (within the respective winding) and a second region 7 with a minimum conductor width Wmin, which are arranged offset by 180° with respect to a rotation about the longitudinal axis Z'. In addition, the windings each have a third region 8 with a maximum conductor width Wmax, which is arranged offset by 90° to the first region 6 with respect to a rotation about the longitudinal axis Z', and a fourth region 9 with a maximum conductor width Wmax, which is arranged offset by 180° to the third region 8 with respect to a rotation about the longitudinal axis Z'. Thus, within each winding 3 the conductor width Wmax increases twice and decreases twice, the regions 6, 7 with minimum conductor width being situated opposite each other. The regions 8, 9 with maximum conductor width are also situated opposite one another. In the embodiment shown here, the increase and decrease of the conductor width W=W(t) are periodic. Furthermore, W(k)=W(k+0.5)=Wmin and W(k+0.25)=W(k+0.75)=Wmax.

In the embodiment shown, the conductor width W can be specified as follows: W(t)=W(0.5+(n−1)), or W(0+(n−1)) <W(0.25+(n−1) or W(0.75+(n−1)), with n a natural number i.e., n∈ℕ. For a periodic widening and tapering of the conductor with two maxima and two minima per winding, the conductor width can be represented as $W(t)=W_0+\Sigma_{m_i}(\sin(2\pi t+\varphi))^{2i}$, where the "phase" φ determines the position of the minima/maxima. In general, $W_0$ and $W_i$ can also have a dependence on t; in particular, they can be different for each winding or half-winding.

Figure 3A:
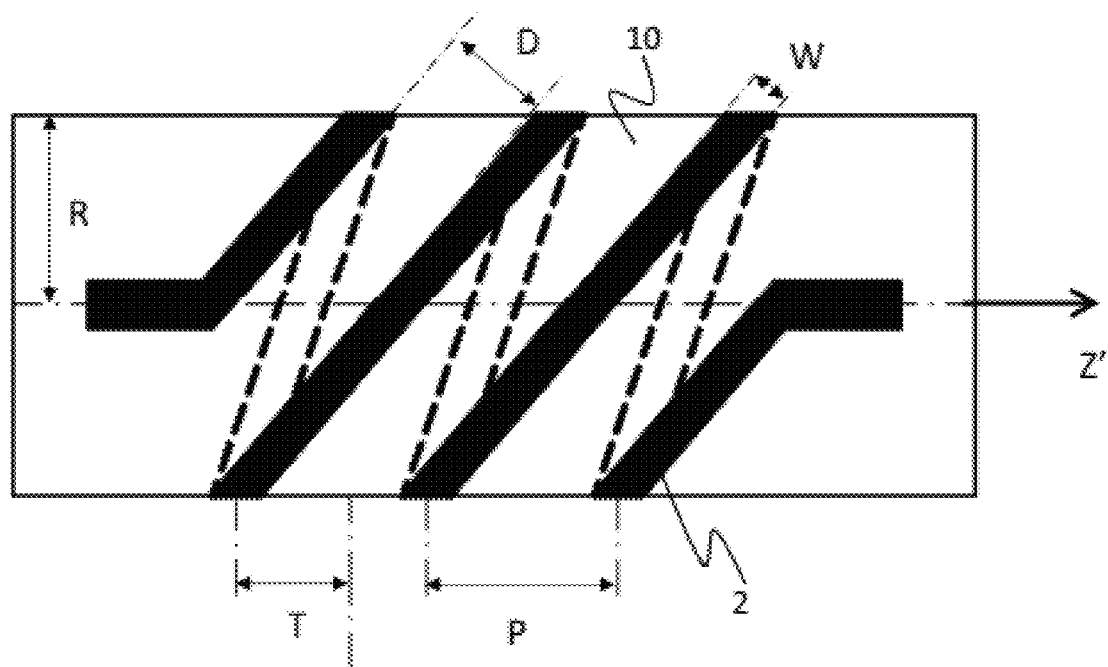
FIG. 3a shows a detail of a solenoid-shaped coil portion for illustrating the coil parameters in a coil with inclined windings.
Figure 3B:
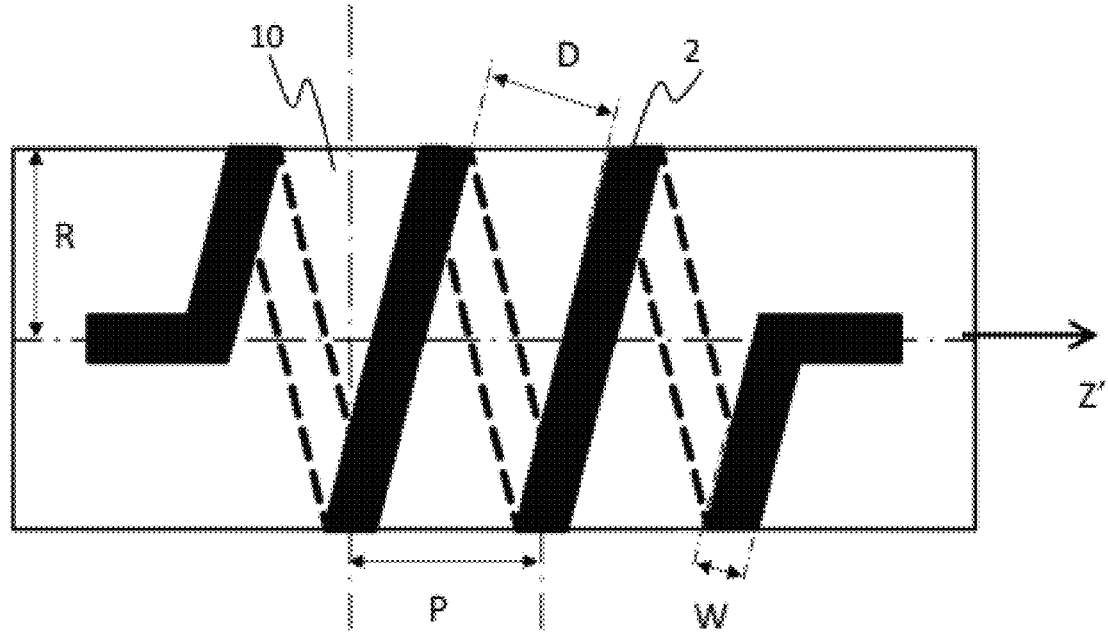
FIG. 3b shows a detail of a solenoid-shaped coil portion for illustrating the coil parameters in a coil with non-inclined windings.

Between the strip-shaped conductor there is a gap 10 with a variable gap width D (see FIG. 3a and FIG. 3b). The gap width D of the intermediate space 10 is at a maximum in the regions 6, 7 with minimum conductor width W. Regions 8, 9 with a large conductor width W lead to an improvement in the quality factor of the first transceiver coil 1, while regions 6, 7 with a small conductor width W but a large gap width D result in increased transparency for any further magnetic fields to be radiated in. As a function of the thickness d of the conductor, there is an optimum ratio W/D at which the quality factor of the coil is maximized.

Figure 2A:
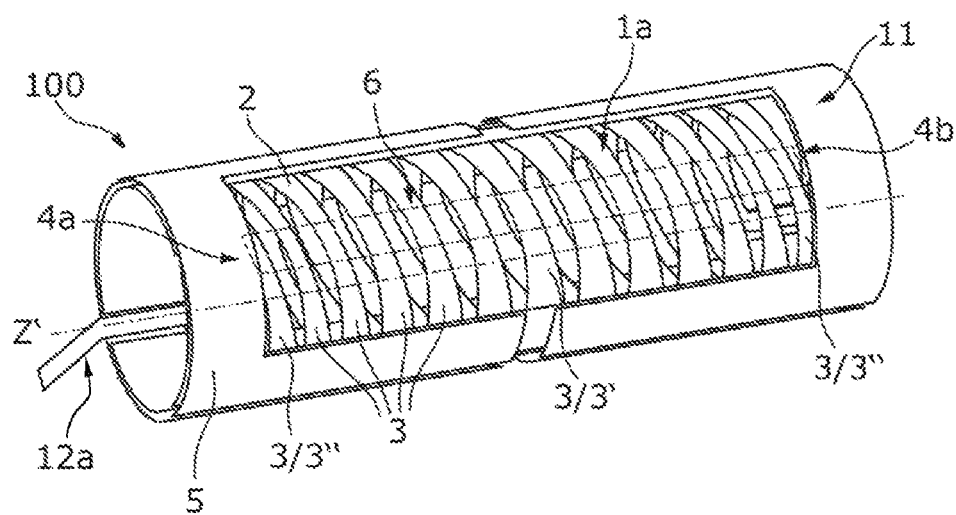
FIG. 2a shows a perspective representation of an embodiment of a transceiver coil arrangement for a probe head according to the invention in an oblique top view with a first transceiver coil arranged inside another transceiver coil (cross-coil geometry).
Figure 2B:
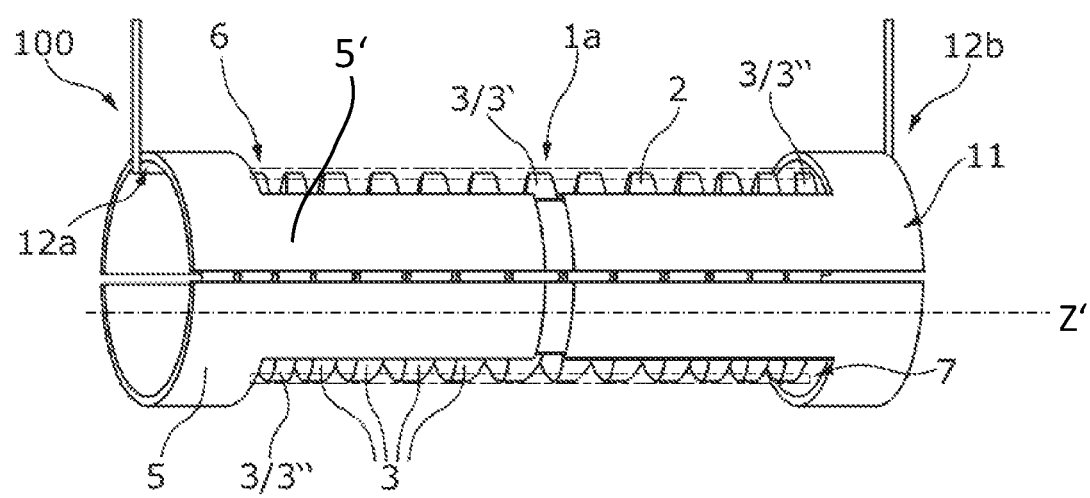
FIG. 2b shows a perspective view of the embodiment of FIG. 2a from the side.

FIGS. 2a, 2b show two angles of a perspective view of an exemplary embodiment of a transceiver coil arrangement 100 with a solenoid-shaped first transceiver coil 1a for generating the first RF magnetic field B1 and with a further transceiver coil 11 for generating the second RF magnetic field B2 for an NMR probe head according to the invention. Here the first transceiver coil 1a is arranged coaxially, radially inside the further transceiver coil 11, so that the second magnetic field B2 generated by the further transceiver coil 11 is substantially perpendicular to the first magnetic field B1 generated by the first transceiver coil 1a. The further transceiver coil 11 is formed here as an Alderman-Grant resonator consisting of two halves 5 and 5', and radially surrounds the first transceiver coil 1a. The first transceiver coil 1a and the further transceiver coil 11 are oriented relative to one another in such a way that the regions 6, 7 of the first transceiver coil 1*a* in which the conductor width W of the electrical conductor 2 of the first transceiver coil 1 has the minimum value lie within the "window" of the further transceiver coil 11 so that the second magnetic field generated by the further transceiver coil 11 runs through the regions 6, 7 (shown in dashed lines in FIGS. 2*a* and 2*b*) of the first transceiver coil 1*a*. As a result, the first transceiver coil 1*a* has a high transparency for the second RF magnetic field B2. Furthermore, the transceiver coil 1*a* has a lower pitch P in the end regions. Since the ratio of the average conductor width to the average gap width W/D is constant in this embodiment, the average conductor width W decreases from a central winding 3' to the terminal windings 3". As an alternative to the embodiment in FIG. 2, the further transceiver coil 11 can also be arranged within the first transceiver coil 1*a*. Likewise, the further transceiver coil can also be designed as a saddle coil, in particular as a multi-winding saddle coil instead of as a resonator (not shown).

The electrical conductor 2 of the first transceiver coil 1 comprises two connection regions 12*a*, 12*b*, each of which is located at an axial end 4*a*, 4*b* of the first transceiver coil 1*a* in the embodiment shown here. There, the transceiver coil 1*b* can be connected via the terminal windings 3" to a matching network (not shown in more detail) in order to supply energy to the transceiver coil 1*b* when transmitting RF pulses, or to detect the signal induced in the coil after excitation of the measurement sample.

Further optimization of the NMR probe head according to the invention can take place by varying coil parameters of the transceiver coil.

FIG. 3*a* and FIG. 3*b* each show a section of a solenoid-shaped coil with a strip-shaped conductor 2, on the basis of which the coil parameters are first illustrated. The solenoid-shaped coil in FIG. 3*a* and FIG. 3*b* is arranged along the longitudinal axis Z' (coil axis), wherein the longitudinal axis Z' is perpendicular to an X'Y' plane. The solenoid-shaped coil is parameterized by the conductor width W of the conductor 2, a gap width D of a gap 10, a pitch P of the windings, an inclination T of the windings, and a radius R of the windings. In the embodiment shown here, a total of three windings are shown.

The conductor width W indicates the width of the conductor 2. The conductor width W is determined via the outermost points of the conductor 2. In the embodiment shown here, the conductor width W is kept constant along the longitudinal axis Z' (i.e., W=const.).

The gap width D indicates the width of the intermediate space 10 between the windings of the conductor 2. The gap width D is determined by the outermost points of the region between the adjacent windings of the conductor 2.

The pitch P of the windings indicates the distance in Z'-direction between two adjacent windings, i.e., the advance of the coil after one complete winding and is determined via the center line of the conductor 2. A constant pitch P does not exclude that the slope S varies within one winding.

The inclination T of the windings indicates the inclination of the windings with respect to the longitudinal axis Z' and corresponds to the amplitude of a sinusoidal modulation of the Z' position of the conductor center plane over one winding. If the slope S and inclination are constant over several windings, it can be easily determined from Max(Z(t)−Z(t+1))−S)/2, where t varies in the interval tn . . . tn+1.

The radius R of the windings indicates the radius on which the conductor 2 lies.

The solenoid coils shown in FIG. 3*a* and FIG. 3*b* each have a constant conductor width W, a constant gap width D, and a constant pitch P; the coil shown in FIG. 3*a* is an inclined coil (T≠0), and the coil shown in FIG. 3*b* is a non-inclined coil (T=0).

In general, the central line of the conductor 2 is defined in Cartesian coordinates as $$\begin{pmatrix} R(t)*\sin(2\pi t) \\ R(t)*\cos(2\pi t) \\ P(t)*t + T(t)*\cos(2\pi t + \varphi) \end{pmatrix}, \text{ with } t \in \{0 \ldots N\},$$

where
φ: Orientation of the inclination of the windings.

The envelope of the conductor 2 in Cartesian coordinates is defined as $$\begin{pmatrix} R(t)*\sin(2\pi t) \\ R(t)*\cos(2\pi t) \\ S(t)*t \pm W(t)/2 + T(t)*\cos(2\pi t + \varphi) \end{pmatrix}, \text{ with } t \in \{0 \ldots N\}.$$

In particular, the conductor width is $W(t)=W_0+\Sigma W_i (\sin(2\pi t+k))^{2i}$, the inclination T is constant over each half-winding, usually the inclination direction is φ=0 (inclination about the Y' axis) or π/2 (inclination about the X' axis) and the radius R(t)=R. The embodiments of the transceiver coil 1, 1*a* according to the invention shown in FIG. 1 and FIG. 2 each have a variable conductor width W=W(t), a constant slope S=const. and inclination T=0.

In the following, specific variants of the transceiver coil geometry according to the invention are described with which the performance of the NMR coil head according to the invention can be further improved by varying the coil parameters.

Figure 4:
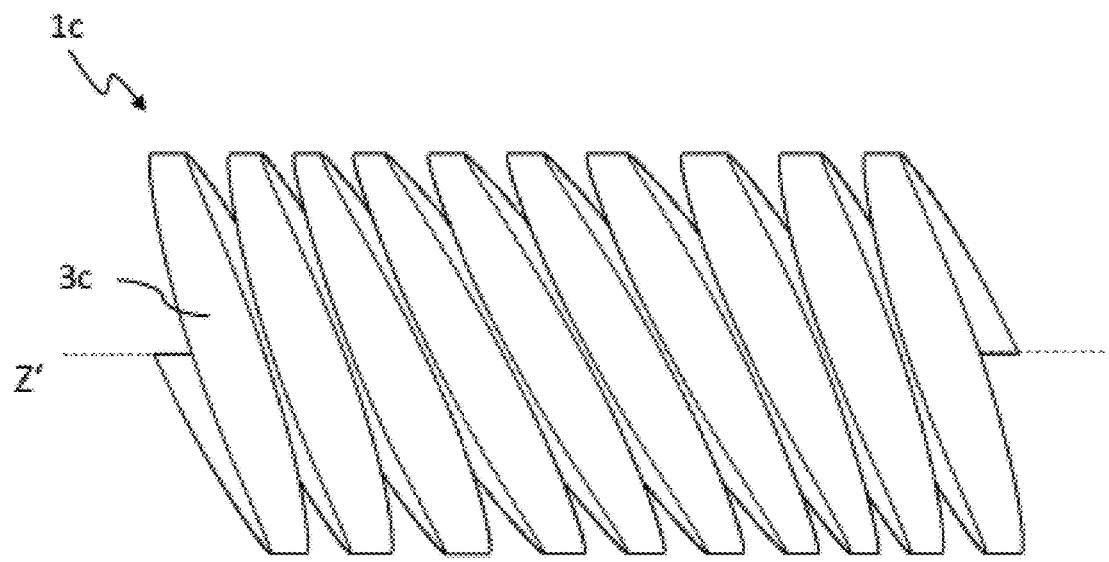
FIG. 4 is a perspective view of an embodiment of a transceiver coil with inclined windings and periodically varying conductor width W within each winding.

FIG. 4 shows an embodiment of the transceiver coil 1*c* according to the invention with periodically varying conductor width W within each winding 3*c*, wherein the windings are inclined with respect to the longitudinal axis Z' of the transceiver coil 1 (T≠0) and the minima of the conductor width occur at the locations of the maxima of the sinusoidal modulation of the conductor position defined by the inclination. Transceiver coils with inclined windings 3*c* can be used particularly advantageously in MAS arrangements in which the longitudinal axis Z' of the transceiver coil 1 is tilted relative to the Z axis of the NMR probe head 23, preferably by the magic angle θ (θ=54.74°) (see FIG. 8).

Figure 5:
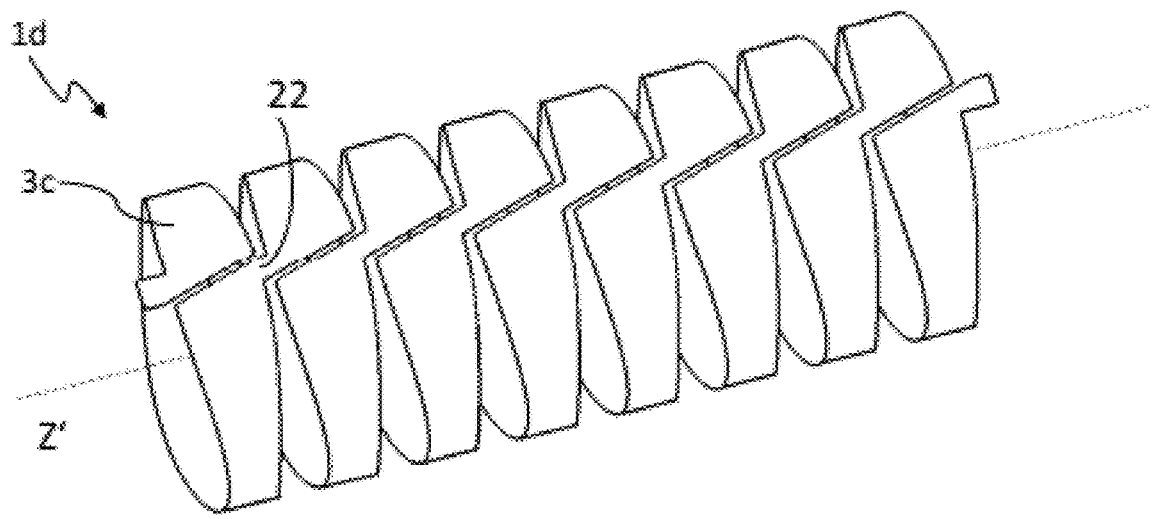
FIG. 5 is a perspective view of an embodiment of a zero-pitch transceiver coil with periodically varying conductor width W within each winding.

FIG. 5 shows a transceiver coil 1*d* according to the invention with periodically varying conductor width W within each winding 3*e*, designed as a zero-pitch coil. The windings 3*e* are formed in the form of non-closed rings connected to each other via connecting sections 22. The slope S within each winding 3*d* is zero. Overall, a constant pitch P=const. is realized by the connecting sections 22.

Figure 6:
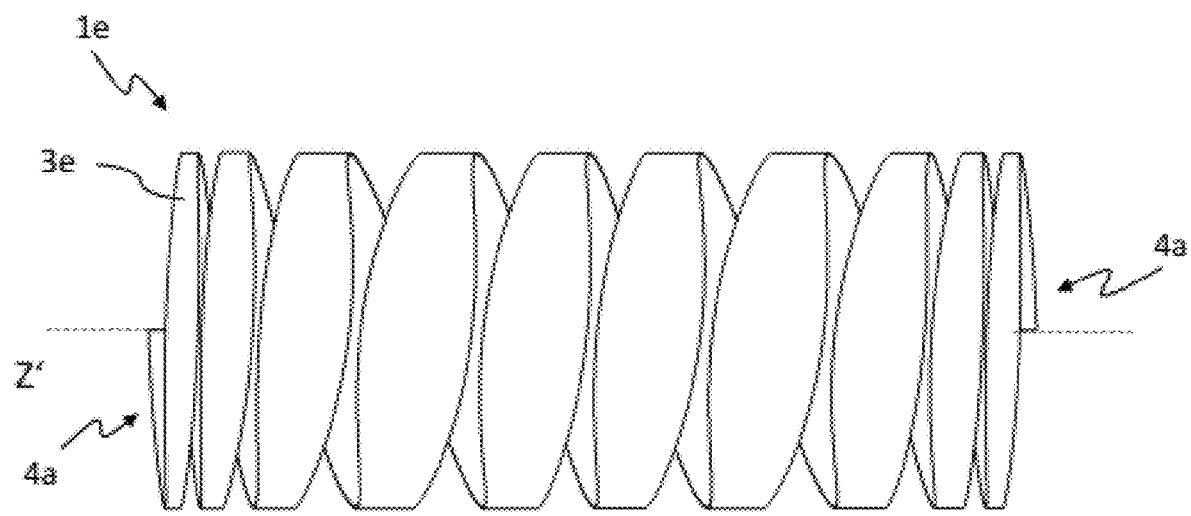
FIG. 6 shows a plan view of an embodiment of a transceiver coil with varying pitch P and periodically varying conductor width W within each winding.

FIG. 6 shows a transceiver coil 1*e* according to the invention with conductor width varying periodically as well as varying pitch P within each winding, wherein both the pitch P and the conductor width W vary along the axis Z', i.e., the pitch P and the maximum width of the conductor change as a function of the axial position of the winding. In the example shown in FIG. 6, both pitch P and conductor width W decrease towards the axial ends 4*a*, 4*b*.

Figure 7:
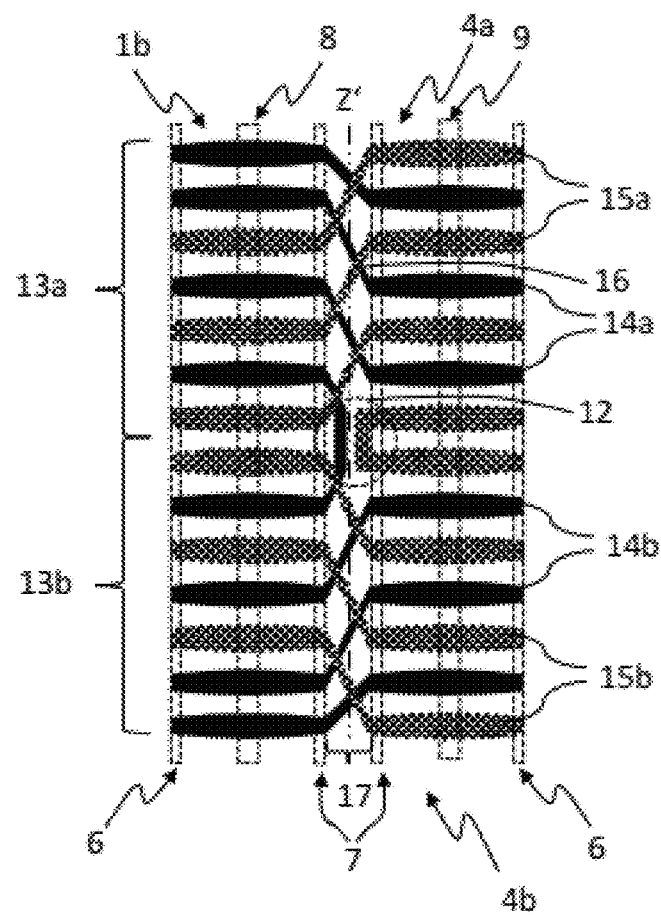
FIG. 7 shows a winding diagram of an embodiment of a transceiver coil arrangement for a probe head according to the invention, having a first transceiver coil having a forward winding section and a return winding section.

FIG. 7 shows a winding representation of a specific embodiment of a first transceiver coil 1*b* for an NMR probe head according to the invention. Here as well, the conductor width W varies twice within each winding according to the invention. This is a zero pitch coil, so that the regions 8, 9 with maximum conductor width lie opposite one another. The regions 6, 7 with minimum conductor width are also situated opposite one another.

In the embodiment shown here, the first transceiver coil 1$b$ has two coil sections 13$a$, 13$b$ with forward windings 14$a$, 14$b$ that each run from a connection region 12 to a respective axial end 4$a$, 4$b$ of the transceiver coil 1$b$, and return windings 15$a$, 15$b$ that run from the respective axial end 4$a$, 4$b$ back to the connection region 12. The return windings 15$a$, 15$b$ have an opposite pitch P with respect to the forward windings 14$a$, 14$b$. The led-back conductors (return windings 15$a$, 15$b$) run on the same surface (here: cylinder surface, not shown in more detail) as the forward conductors (forward windings 14$a$, 14$b$). The forward windings 14$a$, 14$b$ and the return windings 15$a$, 15$b$ are arranged on the common cylinder surface around the longitudinal axis Z'. The return windings 15$b$ are arranged in the spaces between two forward windings 14$a$, 14$b$. The crossovers 16 required for this are realized here on a section of the circumference that is as small as possible (crossover area 17). The crossovers 16 of the forward and return windings 14, 14$b$, 15$a$, 15$b$ can be implemented, for example, by means of bridge elements that lead out of and into the common circumferential surface as connecting elements (not shown in more detail).

Thus, in the geometry of the transceiver coil 1$b$ shown here, windings with opposite potentials are arranged at the same radial distance from the longitudinal axis Z' of the first transceiver coil 1$b$, and in such a way that the potentials of adjacent windings 14$a$-15$a$; 14$b$-15$b$ compensate each other, i.e., are as similar as possible in magnitude but have opposite signs. The electric field is concentrated on the gaps and decays very quickly as the distance from the transceiver coil 1$b$ increases. The electric fields extend only slightly into the interior of the transceiver coil 1$b$, where the field of view is located, in which a measurement sample is situated. This results in minimal electrical fields being introduced into the measurement sample. For cryogenically cooled NMR measurement heads, a good signal-to-noise ratio can be guaranteed even when operating with lossy measurement samples.

The transceiver coil 1$b$ shown here can also be implemented as an embodiment with only one coil section. In this case, the connection region is located at one of the axial ends. The electrical conductor is then guided towards the opposite axial end in a predetermined winding sense and back to the connection region with opposite pitch P and the same winding sense.

Figure 8:
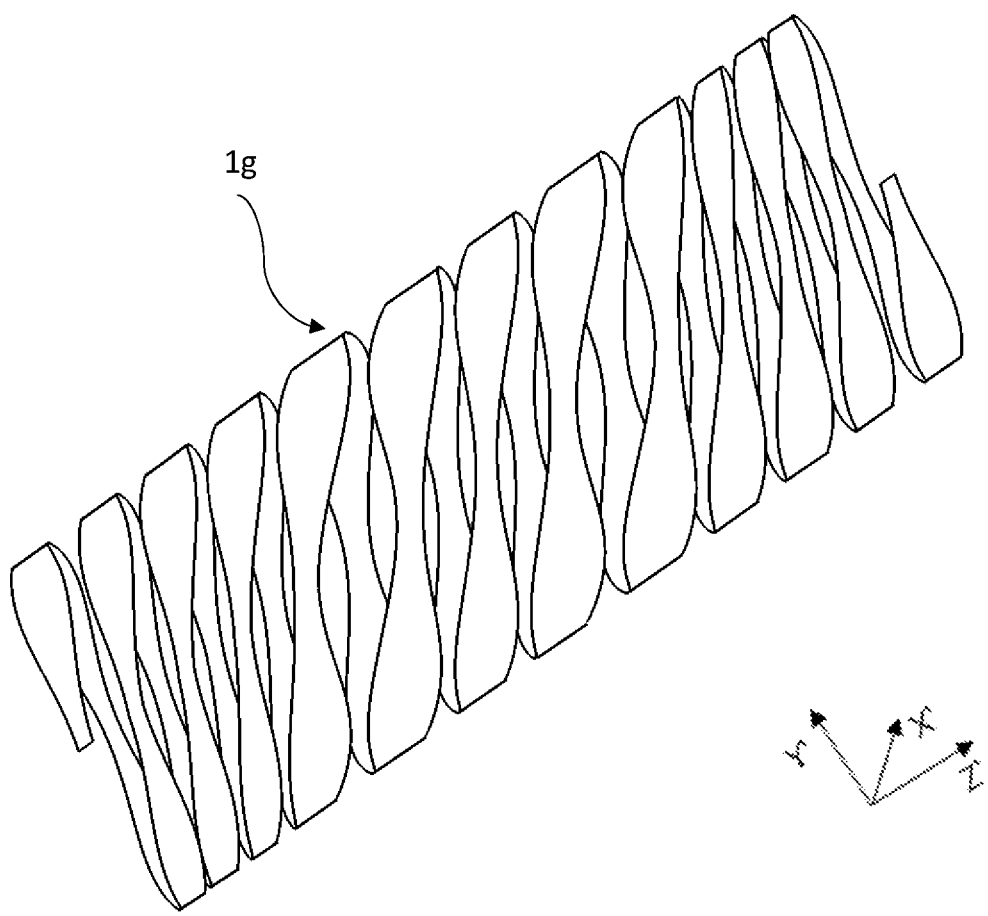
FIG. 8 shows a transceiver coil according to the invention with inclination increasing from both edge regions toward the center, the slope increasing from both edge regions toward the center, and periodically varying conductor width with four maxima and four minima per winding.

FIG. 8 shows a specific embodiment of the transceiver coil 1$g$ according to the invention with inclined windings. The conductor width W changes periodically for the transceiver coil 1$g$ and has four maxima and four minima per winding: two minima along the inclination axis (X' direction) in order to create transparency for a second RF magnetic field B2 of a cross-coil configuration, and two minima perpendicular to the inclination axis (along the Y' direction), in order to "get less in its own way." These minima generally optimize the performance of the first transceiver coil 1$g$ for transceiver coils with inclined windings, whereas the minima that increase transparency optimize the performance of the further transceiver coil (not shown in FIG. 8) at the expense of the first transceiver coil 1$g$.

Figure 9:
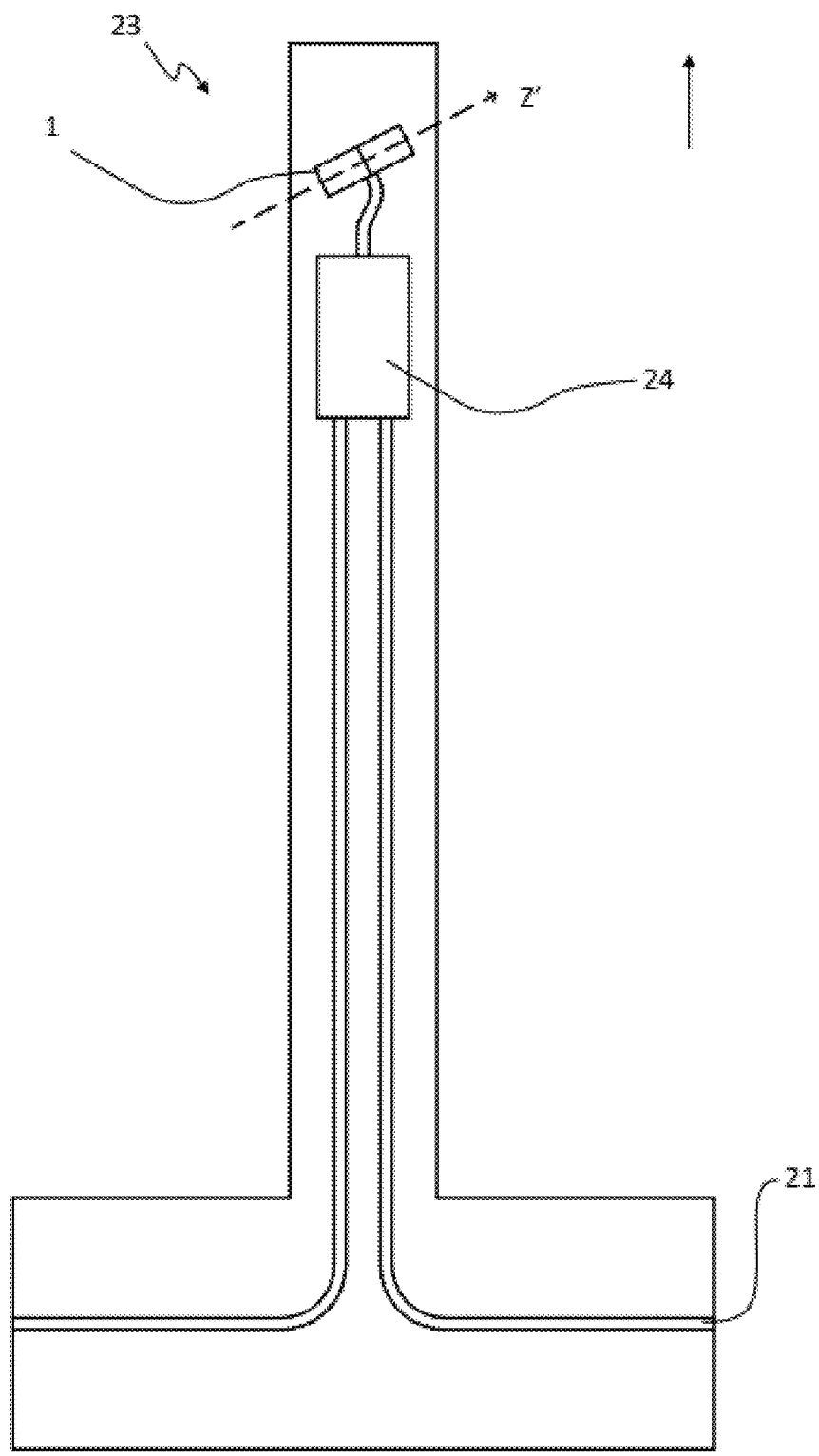
FIG. 9 shows a schematic illustration of an NMR probe head according to the invention.

FIG. 9 shows a schematic illustration of an NMR probe head 23 according to the invention. A static magnetic field for performing NMR measurements will be aligned parallel to a Z-axis during operation in the example shown here. The NMR probe head 23 comprises a transceiver coil 1 according to the invention, which is connected to a matching network 24 and further comprises a spectrometer connection 21. The NMR probe head shown in FIG. 9 is a MAS (magic angle spinning) probe head in which the longitudinal axis Z' of the transceiver coil 1 is tilted, preferably by the magic angle $\theta$ ($\theta$=54.74°), with respect to the Z axis along which the elongated extension of the NMR probe head 23 extends.

LIST OF REFERENCE SIGNS 1, 1$a$-1$e$, 1$g$ first transceiver coil
2 electrical conductor of the first transceiver coil
3 windings of the first transceiver coil
3' central winding of the first transceiver coil
3" terminal winding of the first transceiver coil
4$a$, 4$b$ axial ends of the first transceiver coil
5, 5' halves of the further transceiver coil 11
6 first region of windings with a minimum conductor width
7 second region of the windings with a minimum conductor width
8 third region of windings with a maximum conductor width
9 fourth region of the windings with a maximum conductor width
10 intermediate space between windings of the first transceiver coil
11 further transceiver coil
12, 12$a$, 12$b$ connection region of the first transceiver coil
13$a$, 13$b$ coil section of the first transceiver coil
14$a$, 14$b$ forward windings of the coil section
15$a$, 15$b$ return windings of the coil section
16 crossovers of the electrical conductor
17 crossover region
21 spectrometer connection
22 connection sections
23 NMR probe head
24 matching network
100 transceiver coil arrangement with two transceiver coils
d conductor thickness of the strip-shaped conductor
D gap width of the intermediate space
R radius of the windings
P pitch of the winding
S local slope
T inclination of the windings
W conductor width of the conductor
Z' longitudinal axis
Z direction of the static magnetic field/longitudinal extension of the probe head

The invention claimed is:

1. An NMR probe head having a transceiver coil assembly with a first transceiver coil for generating a first RF magnetic field B1, wherein the first transceiver coil comprises an electrical conductor having multiple windings about a longitudinal axis Z', the electrical conductor being a single strip-shaped conductor with a conductor width W that decreases at least twice and increases at least twice within each of said windings.

2. The NMR probe head according to claim 1, wherein the conductor width W varies periodically, and regions of the electrical conductor with minimum values for the conductor width W are offset by 180° with respect to a rotation about the longitudinal axis.

3. The NMR probe head according to claim 1, wherein a thickness d of the conductor is at most 500 μm and/or is at least as large as twice a penetration depth into the conductor of an RF current carried by the conductor.

4. The NMR probe head according to claim 1, wherein the conductor width W varies between 0.5 mm and 2 mm.

5. The NMR probe head according to claim 1, wherein the windings of the transceiver coil are inclined with respect to the longitudinal axis Z'.

6. The NMR probe head according to claim 1, wherein the transceiver coil assembly further comprises at least one further transceiver coil for generating a second RF magnetic field B2,
wherein the first transceiver coil and the further transceiver coil are arranged around the common longitudinal axis Z' in such a way that RF magnetic fields B1, B2 generated, respectively, by the first transceiver coil and the further transceiver coil are aligned perpendicularly to each other, and
wherein the conductor width W of the electrical conductor of the first transceiver coil has a minimum value in a region in which a surface normal of the first transceiver coil is parallel to the second RF magnetic field B2.

7. The NMR probe head according to claim 6, wherein the further transceiver coil is a saddle coil or a resonator.

8. The NMR probe head according to claim 1, wherein the electrical conductor of the first transceiver coil has at least one solenoid-shaped portion.

9. The NMR probe head according to claim 8, wherein the electrical conductor of the first transceiver coil comprises a forward winding section and a return winding section, the forward winding section comprising forward windings that start from a connection region and lead in a predetermined winding sense to an axial end of the transceiver coil, and the return winding section comprising return windings that start from the axial end of the first transceiver coil and lead in the predetermined winding sense to the connection region, the windings of the return winding section have a pitch P with sign opposite to those of the forward winding section, and
wherein the forward and return windings of the electrical conductor, with the exception of crossover regions in which the forward and return windings cross over each other, are arranged on a common cylindrical jacket surface around the longitudinal axis Z'.

10. The NMR probe head according to claim 9, wherein the forward windings and return windings are arranged alternately.

11. The NMR probe head according to claim 1 wherein a pitch P of the windings of the first transceiver coil varies along the path of the electrical conductor.

12. The NMR probe head according to claim 11, wherein the pitch P at axial ends of the first transceiver coil is smaller than at an axial center.

13. The NMR probe head according to claim 1, wherein the windings of the first transceiver coil along the longitudinal axis Z' of the first transceiver coil have a variable inclination T with respect to the longitudinal axis Z'.

14. The NMR probe head according to claim 13, wherein at least a portion of at least one of the windings is oriented such that a general slope S'(t) of said portion equals zero, where $S'(t)=S(t)+T(t)\cos(2\pi t+\varphi)$, with t being a parameter running between 0 and the number of windings N, T(t) representing the inclination of the windings relative to t and $\varphi$ being a direction of the inclination.

* * * * *